United States Patent [19]

Wieland, Jr.

[11] Patent Number: 5,436,798
[45] Date of Patent: Jul. 25, 1995

[54] SPRING CLIP AND HEAT SINK ASSEMBLY FOR ELECTRONIC COMPONENTS

[75] Inventor: Howard N. Wieland, Jr., Holliston, Mass.

[73] Assignee: Wakefield Engineering, Inc., Wakefield, Mass.

[21] Appl. No.: 184,945

[22] Filed: Jan. 21, 1994

[51] Int. Cl.$^6$ .............................................. H05K 7/20
[52] U.S. Cl. .................................. 361/710; 174/16.3; 165/80.3; 165/185; 257/719
[58] Field of Search ...................... 174/16.3; 165/80.2, 165/80.3, 185; 257/718–719, 726–727; 361/704, 707, 709–711, 717–718, 722

[56] References Cited

U.S. PATENT DOCUMENTS

| | | | |
|---|---|---|---|
| 4,716,494 | 12/1987 | Bright et al. | 361/386 |
| 5,208,731 | 5/1993 | Blomquist | 361/709 |
| 5,276,585 | 1/1994 | Smithers | 361/709 |

OTHER PUBLICATIONS

International Electronic Research Corporation, Bulletin No. 505, Jan. 1992.
International Electronic Research Corporation, Bulletin No. 503, Jan. 1992.
International Electronic Research Corporation, Bulletin No. 506, Dec. 1992.
Thermalloy, "New Heat Sink Spring Clip For Use With AMP Low Insertion Force PCA Sockets", Apr. 1993.
Thermalloy, "Heat Sinks", Jun. 1991.
EG&G Wakefield Engineering "669 Series SpiderClip Heat Sink and Clip Assembly for Intel 80486DX and 80486DX2 Microprocessors", Sep. 1992.

Primary Examiner—Gregory D. Thompson
Attorney, Agent, or Firm—Blodgett & Blodgett

[57] ABSTRACT

A spring clip for clamping a heat sink module which has a plurality of upwardly extending cooling elements to an electronic module. The spring clip includes a horizontal grid like foot portion which engages the upper surface of the heat sink module a vertical leg portion which extends along the side of the heat sink module and the electronic module and a bendable and resilient connecting portion which extends from the inner end of the foot portion to the upper end of the leg portion. The electronic module has a first latching element at its side surface for engaging a complementary second latching element which forms part of the vertical leg portion of the spring clip. The spring clip is rendered from a nonclamping position in which the latching element of the clip is above the latching element of the electronic module to a clamping position by bending the connecting portion downwardly from its inner end to lower the vertical leg portion so that the first and second latching elements are engaged.

24 Claims, 5 Drawing Sheets

SPRING CLIP AND HEAT SINK ASSEMBLY FOR ELECTRONIC COMPONENTS

BACKGROUND OF THE INVENTION

The present invention is generally directed to a spring clip for a heat sink module to an electronic component or assembly of electronic components. The invention is more specifically directed to a spring clip and heat sink assembly for clamping the heat sink assembly to an electronic module or assembly of electronic components such as a microprocessor chip and PGA socket, to which the chip is connected.

A microprocessor chip has a flat upper surface and a lower surface which is provided with a plurality of downwardly extending connecting pins. A PGA socket has pins on its lower surface for plugging into a circuit board and apertures on its upper surface for receiving the pins of a microprocessor chip. Each side of two opposite side surfaces of the PGA socket is provided with first latching means. For one type of PGA socket the first latching means is a pair of recesses. Each recess is defined in part by a downwardly facing edge surface which intersects the adjacent side surface of the PGA socket. Another type of PGA socket has a pair of protrusions on each on the opposite side surface of the socket which constitute first latching means.

A typical heat sink component includes a base which has a flat bottom interface surface and an upper surface from which a plurality of cooling elements such as vanes or pins extend upwardly.

The heat sink is applied to the microprocessor chip after the microprocessor has been plugged into the PGA socket. The bottom interface surface of the heat sink component rests on the upper surface of the chip to provide optimum heat conduction between the chip and the heat sink assembly. The heat sink component and the microprocessor chip are clamped to the PGA socket by spring clips. A typical spring clip includes a pair of spaced vertical leg portions which are connected by a horizontal grid portion. The grid portion is made up of spaced ribs with defined apertures there between. The ribs are configured to mate with the upper surface of the heat sink component so that the ribs rest on the upper surface of the heat sink component and the cooling elements extend upwardly between the ribs. Each leg portion of the clip is provided with a second latching means which is complementary to the first latching means of the PGA socket. For one type of spring clip, each leg portion of the clip has a pair of inwardly extending projections which are designed to engage the downwardly facing edge surfaces of the PGA socket in which the second latching means is a pair of recesses. When the clip is applied to the heat sink module, the projections of the clip are normally above the downwardly facing edge surfaces of the PGA socket. However, the grid portion of clip is bowed downwardly in the middle so that the ends of the grid portion which are connected to the leg portions of the clip are above the upper surface of the heat sink component but never extend above the cooling elements. The application of downward pressure to the ends of the grid portion causes the legs to move downwardly and inwardly relative to the mid portion of the grid so that the projections engage the downwardly facing surface of the PGA socket. Due to the "spring" or resilient nature of the spring clip, the projections are biased upwardly against the downwardly facing edge surfaces and effectively clamp the heat sink component and the microprocessor chip to the PGA socket. For another type of spring clip, the second latching means is a pair of apertures for receiving the projections of PGA sockets for which the projections constitute first latching means.

Although the use of spring clips for anchoring heat sink components to electronic components have been used quite extensively, there are many problems and objections associated with their use. The clips are generally difficult to apply. Special tools are required to apply the clips to the heat sink and electrical component assembly and application of the clips is a tedious and time consuming task. Special tools are also required to disengage the clip from the electrical component assembly when it becomes necessary to do so, i.e. replacement of a chip. In addition, the clips have a tendency to become disengaged from the PGA socket due to vibrations during normal use of the electronic devices to which the electronic components are applied.

For many of the prior art spring clips, some of the cooling elements of the heat sink component must be removed to provide installation and functional clearance to enable the clip to be applied to the heat sink module. This reduces the cooling efficiency of the heat sink component.

Since clips and PGA sockets vary widely in size, clips must also vary in size. The need for clips of different sizes increases the complexity of the process of selecting and supplying clips to the heat sink and electronic components. These and other difficulties experienced with the prior art spring clips have been obviated by the present invention.

It is, therefore, a principal object of the present invention to provide a spring clip for clamping a heat sink component to an electronic component wherein one size of spring clip can be used for heat sink components which vary in width.

Another object of this invention is the provision of a spring clip which can be applied easily to a heat sink component.

A further object of the present invention is the provision of a spring clip for clamping a heat sink component to an electronic component which is resistant to disengagement from its clamping function during normal use of the electronic component.

It is another object of the present invention to provide a spring clip which can be easily pre-assembled to a heat sink component to form a heat sink assembly for application as a unit to an electronic component or electronic assembly. The assembly acts as a unit, and does not require special tools or hand assembly techniques to apply to the electronic component or assembly.

A still further object of the invention is the provision of a spring clip for clamping a heat sink component to an electronic module which is simple in construction, inexpensive to manufacture and easy to use.

A further object of the invention is the provision of a spring clip for clamping a heat sink component to an electronic module which requires no special machining of the heat sink, and no loss of cooling fins to provide installation and functional clearances.

With these and other objects in view, as will be apparent to those skilled in the art, the invention resides in the combination of parts set forth in the specification and covered by the claims appended hereto.

SUMMARY OF THE INVENTION

In general, the invention consists of a spring clip for clamping a heat sink component to an electronic component. The heat sink component includes a base which has an upper surface and a bottom interfacing surface for abutting the upper surface of an electronic component. The heat sink component has a plurality of vertical cooling elements which are fixed to the upper surface of the heat sink component. The spring clip includes a horizontal foot portion which is configured to engage the upper surface of the heat sink module, a vertical leg portion and a bendable and resilient connecting portion which has an inner end which is fixed to the inner end of the foot portion and an outer end which is fixed to the upper end of the leg portion. The lower end of the leg has a latching element which is adapted to engage a complementary latching element on a vertical side surface of the electronic component.

BRIEF DESCRIPTION OF THE DRAWINGS

The character of the invention, however, may be best understood by reference to one of its structural forms, as illustrated by the accompanying drawings in which.

DESCRIPTION OF THE PREFERRED EMBODIMENT

Figure 1:
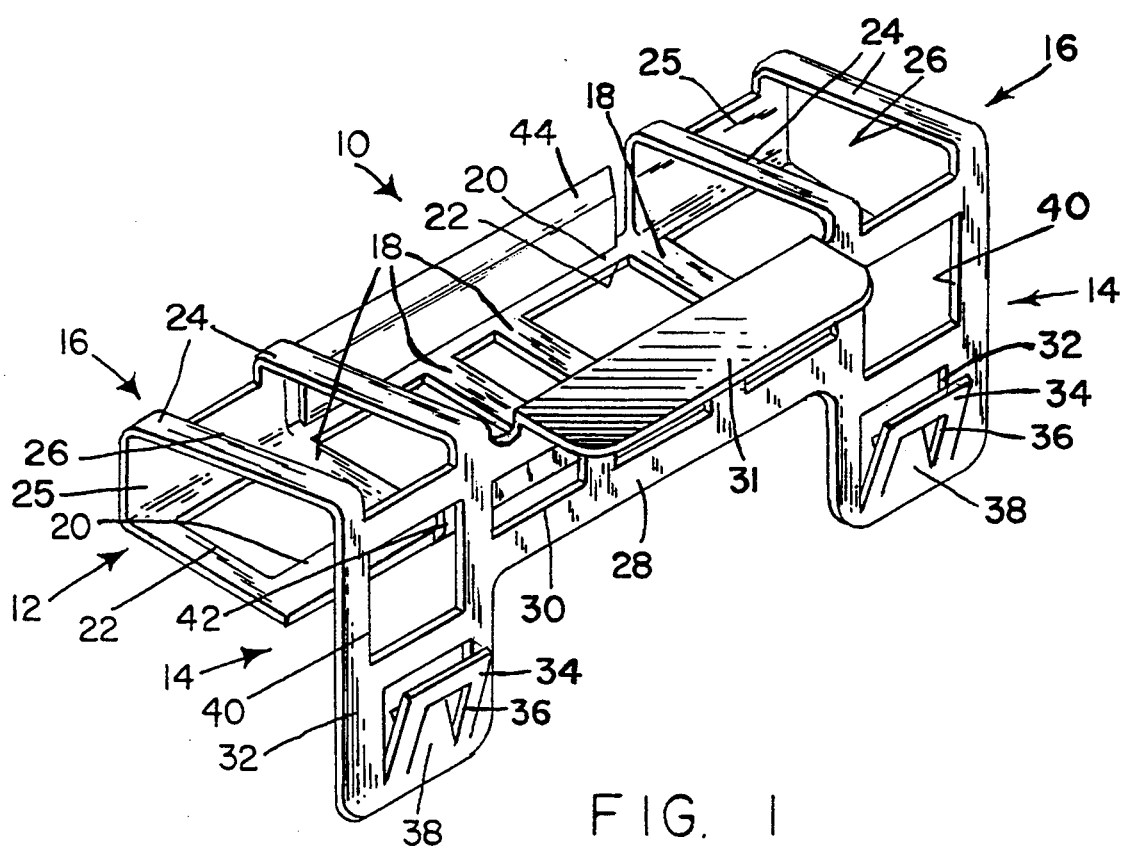
FIG. 1 is a perspective view of a spring clip embodying the principles of the present invention.
Figure 2:
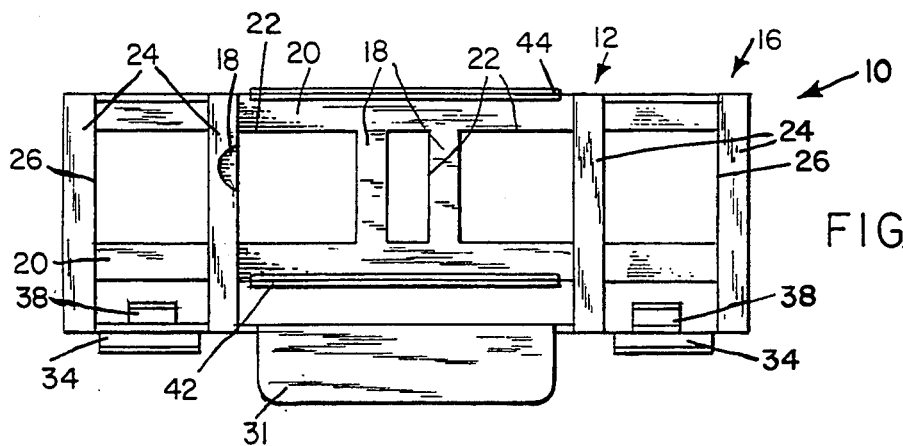
FIG. 2 is a top plan view of the spring clip.
Figure 3:
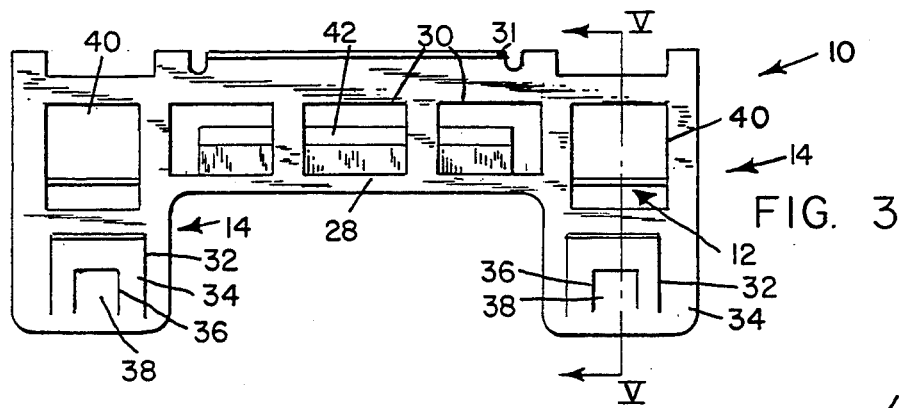
FIG. 3 is a front elevational view of the spring clip.
Figure 5:
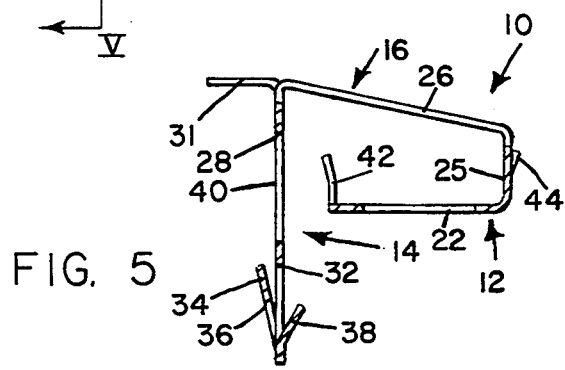
FIG. 5 is a vertical cross sectional view of the spring clip taken along the line V—V of FIG. 3.
Figure 4:
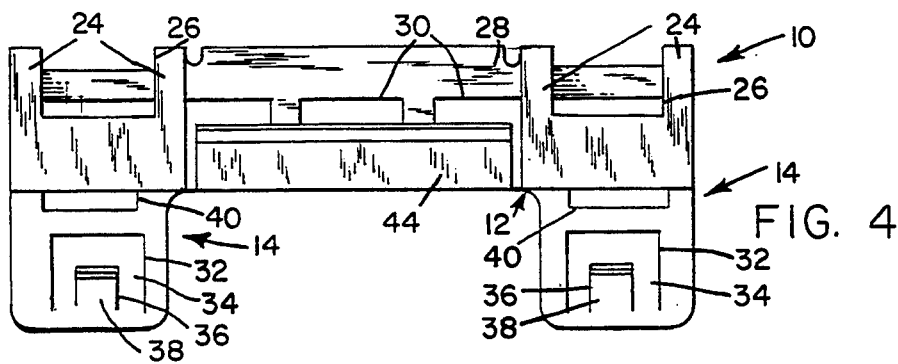
FIG. 4 is a rear elevational view of the spring clip.

Referring first to FIGS. 1-5, the spring clip of the present invention is generally indicated by the reference numeral 10 and comprises a horizontal grid like foot portion, generally indicated by the reference numeral 12, a pair of vertical leg portions generally indicated by the reference numeral 14 and a pair of connecting portions, generally indicated by the reference numeral 16. The grid-like foot portion 12 consists of a plurality of spaced front to back ribs 18 which are connected to a pair of side to side ribs 20. The ribs 18 and 20 define a plurality of generally rectangular apertures 22. Each connecting portion 16 comprises a vertical rear wall portion 25 which is connected to the inner end of the foot portion 12 and a pair of spaced rib portions 24 which extend from the top of the vertical wall 25 at an upward angle toward the top of the leg portion 12 with which the connecting portion 16 is aligned the rib portions 24 define therebetween a generally rectangular aperture 26. The leg portions 14 are connected to a front wall portion 28 which has a plurality of rectangular apertures 30. The upper portion of each leg portion 14 has a rectangular aperture 40. The lower part of each leg portion 14 has a inverted U-shaped cut 32. The material within this cut is bent outwardly to form a projection 34 which extends outwardly and upwardly at an acute angle to the vertical. A smaller inverted U-shaped cut 36 is formed within the projection 34. The material within the U-shaped cut 36 is bent inwardly to form a projection 38 which extends inwardly and upwardly at an acute angle to the vertical. An elongated resilient first finger 42 extends upwardly from the outer end of the foot portion 12. The upper end of the finger 42 is bent at a slight angle toward the leg portion 14. A second elongated resilient finger 44 is fixed to and extends upwardly from the inner end of the foot portion 12. The upper portion of the second finger 45 has a slight bend away from the front wall 28. The spring clip 10 is preferably formed from a flat piece of metal. Other materials including plastic would also be functional.

Figure 6:
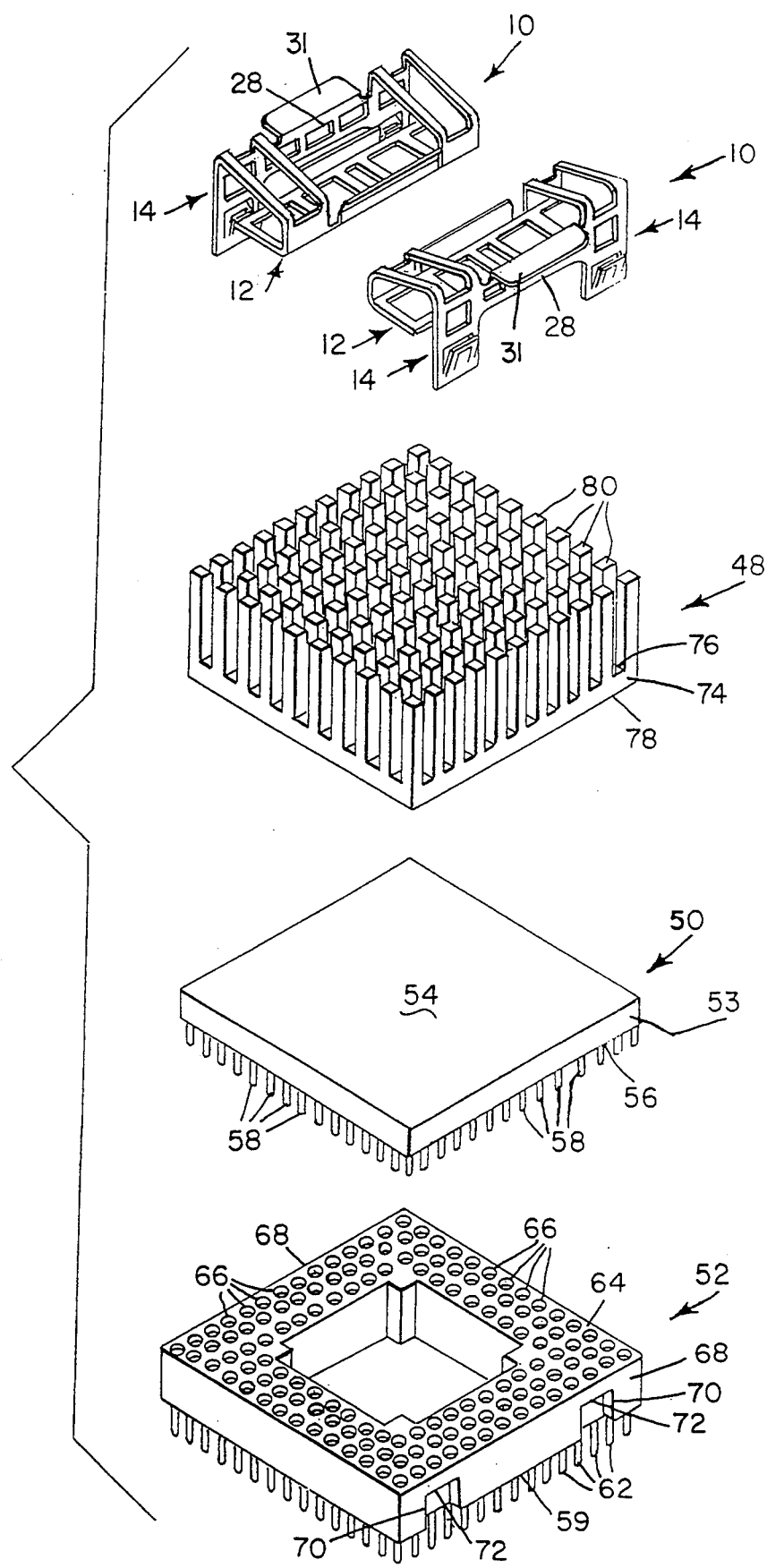
FIG. 6 is an exploded perspective view of a heat sink module, the electronic components to which the heat sink module is applied and a pair of spring clips of the present invention.

Referring to FIG. 6, a pair of spring clips 10 are shown positioned above a typical heat sink module, generally indicated by the reference numeral 48 which is, in turn, positioned above a microprocessor which is generally indicated by the reference numeral 50. The microprocessor chip 50 is positioned above a typical PGA socket which is generally indicated by the reference numeral 52.

The microprocessor chip 50 has a base portion 53 which includes a flat upper surface 54 and a flat bottom surface 56. A plurality of connecting pins 58 extend downwardly from the surface 56. The PGA socket 52 comprises a base portion 59 and a plurality of connecting pins 62. The base portion 59 includes a lower surface 60 and a flat upper surface 68 which contains a plurality of apertures 66 for receiving the connecting pins 58 of the microprocessor chip 50. The pins 62 extend downwardly from the lower surface of the PGA socket 52 for connecting the PGA socket 52 to a conventional circuit board, not shown. The PGA socket 52 also includes a pair of opposite side surfaces 68. Each surface 68 contains a pair of recesses 70. Each recess 70 is defined, in part, by a downwardly facing edge surface 72 which intersects the end surface 68. Each heat sink module 48 comprises a base portion 74 and a plurality of cooling pins 80. The base portion 74 which has a bottom surface 78 and an upper surface 76. The cooling pins 80 are affixed to and extend upwardly from the upper surface 76 and are arranged in a plurality of a spaced rows. The pins within each row of pins are spaced from one another.

Figure 7:
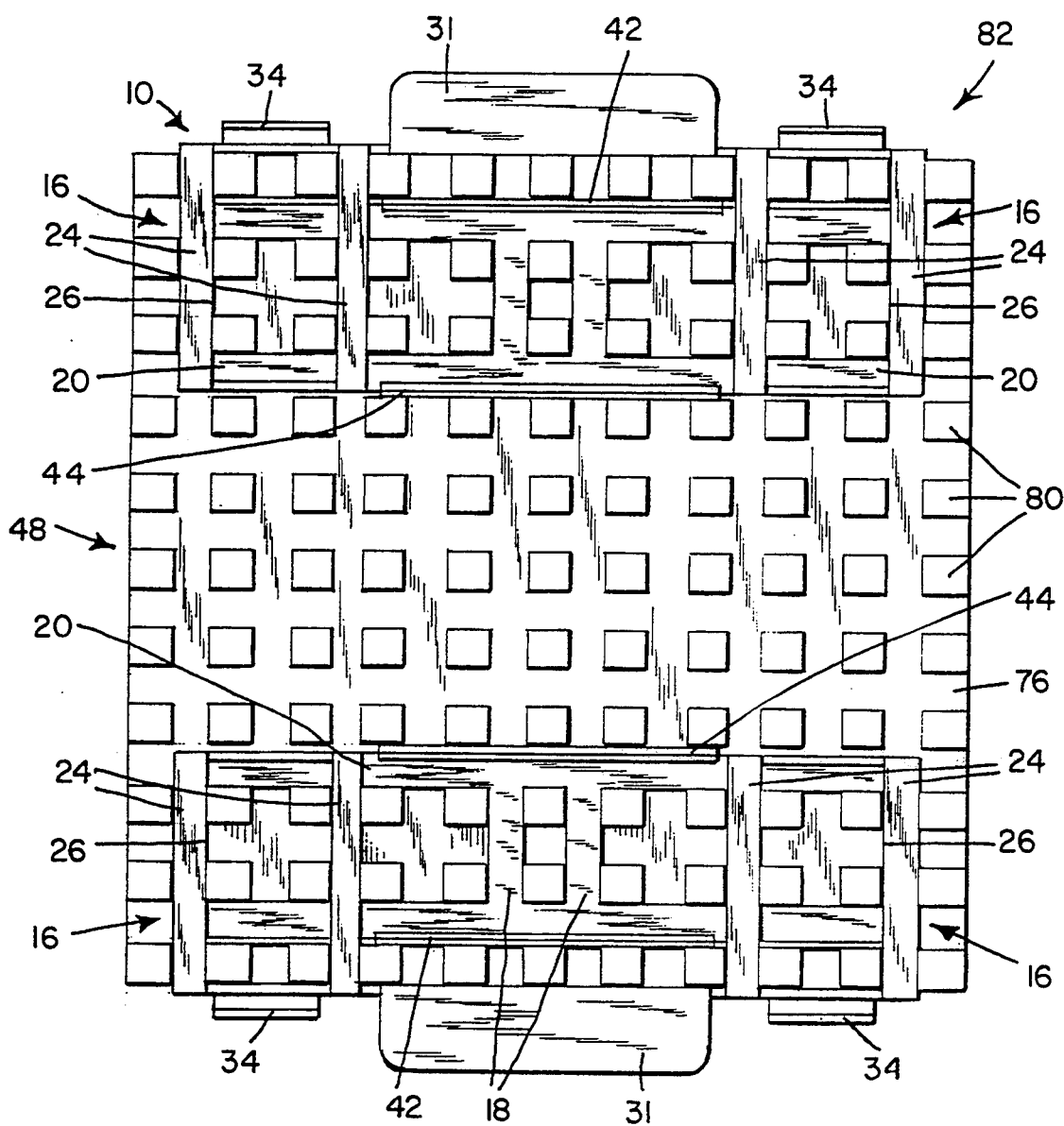
FIG. 7 is a top plan view of a pair of spring clips shown applied to the heat sink module for clamping the heat sink module to an assembly of electronic components.
Figure 8:
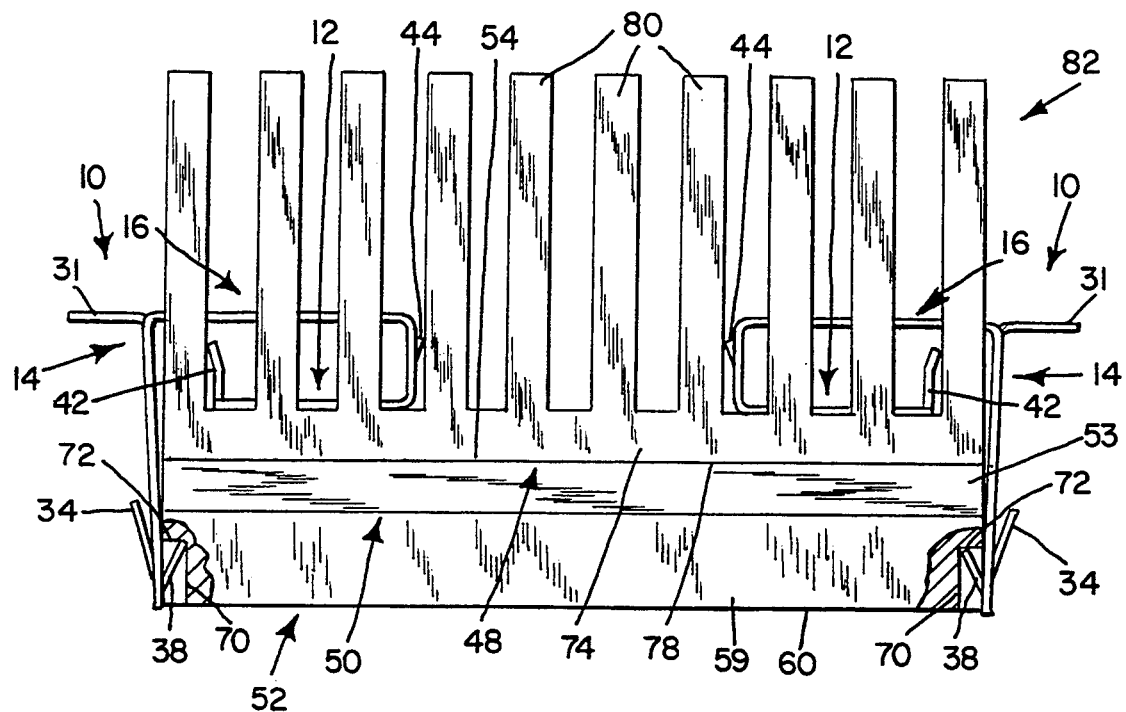
FIG. 8 is a side elevational view of a pair of spring clips shown applied to a heat sink module in clamping position with the assembly of electronic components.

Referring to FIGS. 7 and 8, a pair of spring clips 10 of the present invention are shown applied to opposite ends of a heat sink module 48 and, as shown more clearly in FIG. 8, shown in clamping position with respect to PGA socket 52 for clamping the heat sink module 48 and microprocessor chip 50 to the PGA socket 52. The ribs 24 of the connecting portions 16 are vertically aligned with some of the front and back ribs 18 of the foot portion 12 and all of the ribs of the foot portion 12 and the connecting portion 16 are configured to fit between the rows of cooling pins 80 so that the cooling pins 80 extend upwardly through the apertures 22 of the foot portion 12 and the apertures 26 of the connecting portion 16 as shown in FIG. 7. The spring clips 10 are applied to the heat sink module 48 by positioning the clips at opposite ends of the heat sink module as shown in FIG. 7 and applying downward pressure to the foot portion 12 with appropriate assembly tooling, so as to push the spring clips 10 downwardly along the cooling pins 80 until the foot portion 12 of each clip strikes the upper surface 76 of the heat sink module 48. As the spring clip 10 is moved downwardly along the cooling pins 80, the resilient fingers 42 and 44 are deflected toward one another by adjacent cooling pins to enable the spring clip to be moved downwardly with relative ease. However, upward movement of the spring clip causes the free ends of the fingers 42 and 44 to engage respective of adjacent cooling pins 80 so that upward movement of the spring clip relative to the heat sink module is significantly restricted by the fingers 42 and 44. The heat sink assembly 48 with a pair of spring clips 10 applied securely thereto constitutes a spring clip and heat sink assembly which is generally indicated by the reference numeral 82. The heat sink assembly 82 is applied to the microprocessor chip 50 so that the bottom surface 78 of the heat sink module 48 rests on the upper surface 54 of the microprocessor chip 50. At this point, the microprocessor chip 50 is connected to the PGA socket 52 as shown in FIG. 8. When the spring clip and heat sink assembly 82 is first applied to the microprocessor chip 50 and PGA socket assembly, the spring clips 10 are in their normal non-clamping position. When the spring clip is in this position, the free end of each inwardly extending projection 38 is above the upper surface 72 which is adjacent the recess 70 in the side surface of the PGA socket 52. Each spring clip 10 is rendered to its clamping position by applying downward pressure to the finger tab 31 to bend the connecting portion 16 from its inner end, thereby causing leg portion 14 of the clip to move downwardly and inwardly so that the free end of the projection 38 enters the adjacent recess 70 and the free end of the projection 38 is below the downwardly facing edge surface 72. When pressure is released from the finger tab 31, the resiliency of the connecting portion 16 biases the free end of the projection 38 against the downwardly facing surface 72. This effectively clamps the PGA socket 52 and the microprocessor chip 50 to the heat sink assembly 82. The recess 70 constitutes a first latching element and the projection 38 constitutes a second latching element which is complementary to the first latching element.

The spring clip assembly 82 is removed from its clamping relationship with the microprocessor chip 50 and PGA socket 52 by disengaging the projections 38 from the edge surfaces 72. This is accomplished by inserting a relatively narrow implement such as the end of a screwdriver between the outwardly extending projection 34 and the main wall of the leg portion 14. Downward and outward pressure is then applied to the projection 34 to free the projection 38 from its engagement with the surface 72 against the bias of the connecting portion 16 so that the projection 38 is outside of the recess 70 and clear of the downwardly facing edge surface 72. After all of the projections 38 have been thus cleared from their respective surfaces 72, each spring clip 10 returns to its normal non-clamping position and the spring clip assembly 82 can then be removed from its clamping relationship with the microprocessor chip 50 and PGA socket 52.

Figure 9:
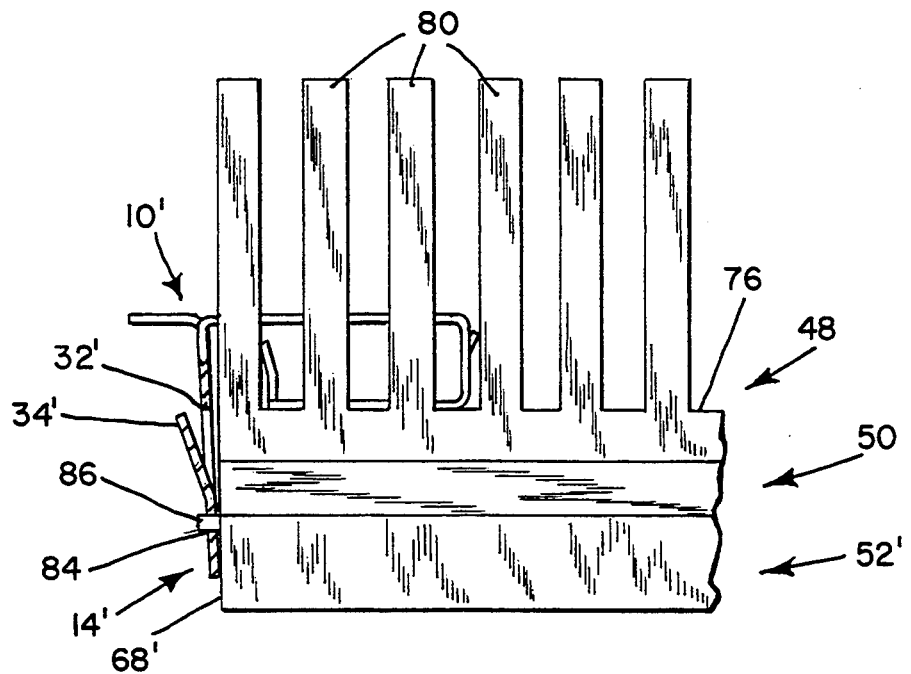
FIG. 9 is a vertical cross sectional view similar to FIG. 5 of a modified spring clip which is adapted for use with an electronic component which has projections in its side surfaces rather than recesses.

Referring to FIG. 9 there is shown an alternative construction of a spring clip generally indicated by the reference numeral 10'. Spring clip 10' is identical to spring clip 10 except for the leg portions which are generally indication by the reference numeral 14' each leg portion 14' has an aperture 84 for receiving a projection 86 of a modified PGA socket 52'. PGA socket 52' is similar to PGA socket 52 except that each of two opposite end surfaces, identified by the reference numeral 68', has a pair of outwardly extending projections 86 instead of recesses 70. Each projection 86 constitutes a first latching element. Each aperture 84 constitutes a second latching element which is complementary to the first latching element represented by the projection 86. When the spring clip and heat sink assembly which is indicated by the reference numeral 82' in FIG. 9 is applied to the microprocessor chip 50' and PGA socket 52', the apertures 84 are located above the projections 86 when the spring clip 10' is in its non-clamping position. The spring clip 10' is rendered to its clamping position by applying downward pressure against the finger tab 31' this causes the connecting portion 16' to bend downwardly from its inner end so that the leg portion 14' moves downwardly until each aperture 84 is horizontally aligned with its respective projection 86 and the projection 86 enters the aperture 84 as shown in FIG. 9. The leg 14' has an upwardly and outwardly extending projection 34' which enables downward and outward pressure to be applied to the leg portion 14 in the same manner as for the projection 34 of the spring clip 10 for moving the aperture 84 away from its engagement with the projection 86 and for allowing the spring clip 10 to return to its non-clamping position so that the spring clip and heat sink assembly 82 can be removed from the microprocessor chip 50.

It is obvious that minor changes may be made in the form and construction of the invention without departing from the material spirit thereof. It is not, however, desired to confine the invention to the exact forms herein shown and described, but it is desired to include all such as properly come within the scope claimed.

The invention having been thus described, what is claimed is new and desired to secure by Letters Patent is:

1. A spring clip having a non-clamping position and a clamping position for clamping a heat sink module to an electronic component, so that the heat sink module is between the spring clip and the electronic component, said spring clip comprising:

(a) a horizontal foot portion which has an inner end and an outer end, said foot portion having a plurality of spaced ribs for engaging the upper surface of a heat sink module;

(b) a vertical leg portion having an upper end which is higher than said foot portion and a lower end which is lower than said foot portion, said leg portion being a flat strip of sheet metal having a broad side surface which faces said foot portion, the lower end of said leg portion having an outer inverted U-shaped cut, an outer projection which has an upwardly facing free end edge being formed from the portion of said leg portion which lies within said cut and which is bent along a horizontal line at the bottom of said cut so that said outer projection extends at an angle away from said foot portion, said leg portion having an inner inverted U-shaped cut within the area of said outer projection, an inner projection which has an upwardly facing free end edge being formed from the portion of said outer projection which lies within said inner cut, said inner projection being bent along a horizontal line at the bottom of said inner cut so that said inner projection extends at an angle toward said foot portion; and (c) a bendable and resilient connecting portion which has an inner end which is fixed to said foot portion and an outer end which is fixed to the upper end of said leg portion so that said leg portion is spaced from the outer end of said foot portion, said spring clip being normally in its non-clamping position, said spring clip being rendered to its said clamping position upon application of downward pressure to said leg portion so as to cause said connecting portion to bend downwardly from the inner end of said connecting portion and to lower said leg portion relative to said foot portion for enabling said outer projection to engage a downwardly facing surface of an electronic component to which said spring clip is applied.

2. A spring clip having a non-clamping position and a clamping position for clamping a heat sink module to an electronic component, so that the heat sink module is between the spring clip and the electronic component, said spring clip comprising:

(a) a horizontal foot portion which has an inner end and an outer end, said foot portion having a plurality of spaced ribs for engaging the upper surface of a heat sink module;

(b) a vertical leg portion having an upper end which is higher than said foot portion and a lower end which is lower than said foot portion, the lower end of said vertical leg portion having a latching element for engaging a complementary latching element of an electronic component;

(c) a bendable and resilient connecting portion which has an inner end which is fixed to said foot portion and an outer end which is fixed to the upper end of said leg portion so that said leg portion is spaced from the outer end of said foot portion, said spring clip being normally in its non-clamping position, said spring clip being rendered to its clamping position upon application of downward pressure to said leg portion so as to cause said connecting portion to bend downwardly from the inner end of said connecting portion and to lower said leg portion relative to said foot portion for enabling said latching element to engage a complementary latching element of an electronic component to which said spring clip is applied; and (d) a resilient finger which is fixed to said foot portion and which extends upwardly from said foot portion, said finger having a free upper end for engaging at least one of an upwardly extending cooling element of a heat sink to which said spring clip is applied to provide substantial resistance to the upward movement of said foot portion relative to the heat sink while providing minimal resistance to the downward movement of said foot portion relative to the heat sink.

3. A spring clip as recited in claim 2, wherein at least the upper portion of said finger is at an angle to the vertical.

4. A spring clip having a non-clamping position and a clamping position for clamping a heat sink module to an electronic component, so that the heat sink module is between the spring clip and the electronic component, said spring clip comprising:

(a) a horizontal foot portion which has an inner end and an outer end, said foot portion having a plurality of spaced ribs for engaging the upper surface of a heat sink module;

(b) a vertical leg portion having an upper end which is higher than said foot portion and a lower end which is lower than said foot portion, the lower end of said vertical leg portion having a latching element for engaging a complementary latching element of an electronic component;

(c) a bendable and resilient connecting portion which has an inner end which is fixed to said foot portion and an outer end which is fixed to the upper end of said leg portion so that said leg portion is spaced from the outer end of said foot portion, said spring clip being normally in its non-clamping position, said spring clip being rendered to its clamping position upon application of downward pressure to said leg portion so as to cause said connecting portion to bend downwardly from the inner end of said connecting portion and to lower said leg portion relative to said foot portion for enabling said latching element to engage a complementary latching element of an electronic component to which said spring clip is applied;

(d) a resilient first finger which is fixed to the inner end of said foot portion and which extends upwardly from said foot portion, said first finger having a free upper end for engaging at least one of an upwardly extending cooling element of a heat sink to which said spring clip is applied; and (e) a resilient second finger which is fixed to the outer end of said foot portion and which extends upwardly from said foot portion, said second finger having a free upper end for engaging at least one of an upwardly extending cooling element of a heat sink, said first and second fingers providing substantial resistance to the upward movement of said foot portion relative to the heat sink while providing minimal resistance to the downward movement of said foot portion relative to the heat sink.

5. A spring clip as recited in claim 4; wherein at least the upper end of each of said first and second fingers is at an angle to the vertical.

6. A spring clip as recited in claim 5; wherein the upper ends of said first and second fingers extend away from each other.

7. A spring clip as recited in claim 6, wherein the upper end of said first finger extends upwardly at an angle toward said leg portion and the upper end of said second finger extends upwardly at an angle away from said leg portion.

8. A spring clip having a non-clamping position and a clamping position for clamping a heat sink module to an electronic component, so that the heat sink module is between the spring clip and the electronic component, said spring clip comprising:

(a) a horizontal foot portion which has an inner end and an outer end, said foot portion having a plurality of spaced ribs for engaging the upper surface of a heat sink module;

(b) a vertical leg portion having an upper end which is higher than said foot portion and a lower end which is lower than said foot portion, the lower end of said vertical leg portion having a latching element for engaging a complementary latching element of an electronic component;

(c) a bendable and resilient connecting portion which has an inner end which is fixed to said foot portion and an outer end which is fixed to the upper end of said leg portion so that said leg portion is spaced from the outer end of said foot portion, said spring clip being normally in its non-clamping position, said spring clip being rendered to its clamping position upon application of downward pressure to said leg portion so as to cause said connecting portion to bend downwardly from the inner end of said connecting portion and to lower said leg portion relative to said foot portion for enabling said latching element to engage a complementary latching element of an electronic component to which said spring clip is applied; and (d) a substantially horizontal finger tab which is fixed to said leg portion, said finger tab extending outwardly away from said leg portion.

9. A spring clip having a non-clamping position and a clamping position for clamping a heat sink module to an electronic component, so that the heat sink module is between the spring clip and the electronic component, said spring clip comprising:

(a) a horizontal foot portion which has an inner end and an outer end, said foot portion having a plurality of spaced ribs for engaging the upper surface of a heat sink module;

(b) a vertical leg portion having an upper end which is higher than said foot portion and a lower end which is lower than said foot portion, the lower end of said vertical leg portion having a projection for engaging a downwardly facing surface of an electronic module, said leg portion being a flat strip of sheet metal having a broad side surface which faces said foot portion, said fiat strip having an inverted U-shaped cut, said projection being formed from the portion of said strip which lies within said cut and which is bent along a horizontal line at the bottom of said cut so that said projection extends at an angle toward said foot portion; and (c) a bendable and resilient connecting portion which has an inner end which is fixed to said foot portion and an outer end which is fixed to the upper end of said leg portion so that said leg portion is spaced from the outer end of said foot portion, said spring clip being normally in its non-clamping position, said spring clip being rendered to its clamping position upon application of downward pressure to said leg portion so as to cause said connecting portion to bend downwardly from the inner end of said connecting portion and to lower said leg portion relative to said foot portion for enabling said projection to engage a downwardly facing surface of an electronic component to which said spring clip is applied.

10. A spring clip and heat sink assembly for application to an electronic component having a downwardly facing edge surface, said spring clip and heat sink assembly comprising:

(a) a heat sink module having a base which has a first end, a second end which is opposite and first end, an upper surface and a bottom surface for abutting the upper surface of an electronic component, said heat sink module having a plurality of spaced upwardly extending vertical cooling elements which are fixed to the upper surface of said heat sink module;

(b) a first spring clip having a non-clamping position and a clamping position for clamping the first end of said heat sink module to an electronic component, said first spring clip comprising:

(1) a horizontal first foot portion which has an inner end and an outer end, said first foot portion having a plurality of spaced ribs which extend between said vertical cooling elements, said ribs engaging the upper surface of said heat sink module;

(2) a vertical first leg portion having an upper end which is higher than said horizontal first foot portion and a lower end which is below said horizontal foot portion, said first leg portion having a first projection which extends away from said first foot portion, said first projection having a free end edge; and (3) a bendable and resilient first connecting portion which is spaced from the upper surface of said base, said first connecting portion having an inner end which is fixed to said first foot portion and an outer end which is fixed to the upper end of said first leg portion so that said first leg portion is spaced from the outer end of said first foot portion, said spring clip being normally in its non-clamping position, said first spring clip being rendered to its clamping position upon application of downward pressure to said first leg portion so as to cause said first connecting portion to bend downwardly from the inner end of said first connecting portion and to lower said first leg portion relative to said foot portion for enabling the free end edge of said first projection to engage a downwardly facing surface of an electronic component to which said spring clip and heat sink assembly is applied; and (c) a second spring clip having a non-clamping position and a clamping position for clamping the second end of said heat sink module to an electronic component, said second spring clip comprising:

(1) a horizontal second foot portion which has an inner end and an outer end, said second foot portion having a plurality of spaced ribs which extend between said vertical cooling elements, said ribs engaging the upper surface of said heat sink module;

(2) a vertical second leg portion having an upper end which is higher than said horizontal second foot portion and a lower end which is below said horizontal second foot portion, said second leg portion having a second projection which extends away from said second foot portion, said second projection having a free end edge; and (3) a bendable and resilient second connecting portion which is spaced from the upper surface of said base, said second connecting portion having an inner end which is fixed to said second foot portion and an outer end which is fixed to the upper end of said second leg portion so that said second leg portion is spaced from the outer end of said second foot portion, said spring clip being normally in its non-clamping position, said second spring clip being rendered to its clamping position upon application of downward pressure to said second leg portion so as to cause said second connecting portion to bend downwardly from the inner end of said second connecting portion and to lower said second leg portion relative to said foot portion for enabling the free end edge of said first projection to engage a downwardly facing surface of an electronic component to which said spring clip and heat sink assembly is applied.

11. A spring clip and heat sink assembly as recited in claim 10, wherein each of said first and second projection extends upwardly at an acute angle to the vertical toward said heat sink module.

12. A spring clip and heat sink assembly as recited in claim 10, wherein each of said first and second spring clips is made of metal.

13. A spring clip and heat sink assembly as recited in claim 10, wherein each of said first and second spring clips further comprises a resilient finger which is fixed to the foot portion of the clip and which extends upwardly from the foot portion, each of said resilient fingers having a free upper end which engages at least one of said vertical cooling elements to provide substantial resistance to the upward movement of its corresponding spring clip relative to the upper surface of the base of said heat sink module while providing minimal resistance to the downward movement of said corresponding spring clip relative to said upper surface.

14. A spring clip and heat sink assembly as recited in claim 13, wherein at least the upper end of each of said fingers is at an angle to the vertical toward the vertical cooling element which is engaged by the finger.

15. A spring clip and heat sink assembly as recited in claim 10, wherein each of said spring clips further comprises:
(a) a resilient first finger which is fixed to the inner end of the foot portion of its corresponding spring clip and which extends upwardly from the foot portion of said corresponding spring clip, said first finger having a free upper end which engages at least one of said vertical cooling elements; and
(b) a resilient second finger which is fixed to the outer end of the foot portion of said corresponding spring clip and which extends upwardly from the foot portion of said corresponding spring clip, said second finger having a free upper end which engages at least one of said vertical cooling elements, said first and second fingers providing substantial resistance to the upward movement of said corresponding spring clip relative to the upper surface of said base while providing minimal resistance to the downward movement of said corresponding spring clip relative to the upper surface of said base.

16. A spring clip and heat sink assembly as recited in claim 15, wherein at least the upper end of each of said first and second fingers is at an angle to the vertical.

17. A spring clip and heat sink assembly as recited in claim 16, wherein the upper ends of the first and second fingers of each of said spring clips extend away from each other.

18. A spring clip and heat sink assembly as recited in claim 17, wherein the upper end of said first finger extends upwardly at an angle toward the portion of said corresponding spring clip and the upper end of said second finger extends upwardly at an angle away from the leg portion of said corresponding spring clip.

19. A spring clip and heat sink assembly as recited in claim 10, wherein each of said first and second spring clips further comprises a substantially horizontal finger tab which is fixed to the leg portion of its corresponding spring clip, said finger tab extending outwardly away from said heat sink module.

20. A spring clip and heat sink assembly as recited in claim 10, wherein the leg portion of each of said first and second spring clips has at least one aperture which is horizontally aligned with said vertical cooling elements.

21. A spring clip and heat sink assembly as recited in claim 10, wherein the inner end of the connecting portion of each of said first and second spring clips is fixed to the inner end of the foot portion of its respective spring clip, each of said connection portions having spaced ribs which extend between said vertical cooling elements so that said vertical cooling elements extend upwardly above said connecting portions.

22. A spring clip and heat sink assembly as recited in claim 10, wherein the projection for each of said first and second spring clips is an inner projection, each of said first and second spring clips further comprising an outer projection which is fixed to the foot portion of its respective spring clip and which extends away from said heat sink module, said inner and outer projections being located below said heat sink module, so that an applied downward pressure against each of said outer projections will cause the foot portion of its corresponding spring clip to move downwardly for disengaging the inner projection of its corresponding spring clip from a downwardly facing edge surface of an electronic component to which said spring clip and heat sink assembly is applied.

23. A spring clip and heat sink assembly as recited in claim 22, wherein said outer projection extends upwardly at an acute angle to the leg portion of its corresponding spring clip.

24. A spring clip having a non-clamping position and a clamping position for clamping a heat sink module to an electronic component so that the heat sink module is between the spring clip and the electronic component, said spring clip comprising:
(a) a horizontal foot portion which has a first component for engaging an upper surface of a heat sink module and a second component for frictionally engaging cooling elements which extend vertically from the upper surface of a heat sink module for holding the spring clip on the upper surface of a heat sink module;
(b) a vertical leg portion having an upper end which is higher than said foot portion and a lower end which is lower than said foot portion, the lower end of said vertical leg portion having a latching element for engaging a complementary latching element of an electronic component; and
(c) a bendable and resilient connecting portion which has an inner end which is fixed to said foot portion and an outer end which is fixed to the upper end of said leg portion so that said leg portion is spaced from said foot portion, said spring clip being normally in its non-clamping position, said spring clip being rendered to its clamping position upon application of downward pressure to said leg portion so as to cause said connecting portion to bend downwardly from the inner end of said connecting portion and to lower said leg portion relative to said foot portion for enabling said latching element to engage a complementary latching element of an electronic component to which said spring clip is applied.

* * * * *